United States Patent
Fogal et al.

[11] Patent Number: 5,874,781
[45] Date of Patent: Feb. 23, 1999

[54] ANGULARLY OFFSET STACKED DIE MULTICHIP DEVICE AND METHOD OF MANUFACTURE

[75] Inventors: Rich Fogal; Michael B. Ball, both of Boise, Id.

[73] Assignee: Micron Technology, Inc., Boise, Id.

[21] Appl. No.: 741,579

[22] Filed: Nov. 1, 1996

Related U.S. Application Data

[63] Continuation of Ser. No. 515,719, Aug. 16, 1995, abandoned.

[51] Int. Cl.$^6$ .......................... H01L 23/48; H01L 23/52; H01L 29/40
[52] U.S. Cl. ......................... 257/777; 257/723; 257/724
[58] Field of Search ................................. 257/723, 724, 257/685, 686, 777; 437/205, 206, 207, 208

[56] References Cited

U.S. PATENT DOCUMENTS

| | | |
|---|---|---|
| 4,996,587 | 2/1991 | Hinrichsmeyer et al. . |
| 5,012,323 | 4/1991 | Farnworth . |
| 5,291,061 | 3/1994 | Ball .................................. 257/782 |
| 5,313,693 | 5/1994 | Cachier ............................. 437/206 |
| 5,323,060 | 6/1994 | Fogal et al. ....................... 257/777 |
| 5,422,435 | 6/1995 | Takiar et al. ...................... 257/777 |

FOREIGN PATENT DOCUMENTS

| | | | |
|---|---|---|---|
| 0489643 1 | 6/1992 | European Pat. Off. .................... 25/18 |
| 489643-A1 | 6/1992 | European Pat. Off. ........ H01L 25/18 |
| 56-62351 | 8/1981 | Japan . | |
| 4/25166 | 1/1992 | Japan ............................. H01L 25/65 |

*Primary Examiner*—Mahshid Saadat
*Assistant Examiner*—S. V. Clark

[57] ABSTRACT

An offset die stacking arrangement is disclosed having at least one upper level die having a width which is less than the distance separating the opposing bonding sites of the underlying die. The upper die is fixed above the lower die and rotated within a plane parallel to the lower die through an angle which insures that none of the bonding sites of the lower die are obstructed by the upper die. Once the dice are fixed in this manner, the entire assembly is subjected to the wire bonding process with all of the bonds being made in the same step.

12 Claims, 4 Drawing Sheets

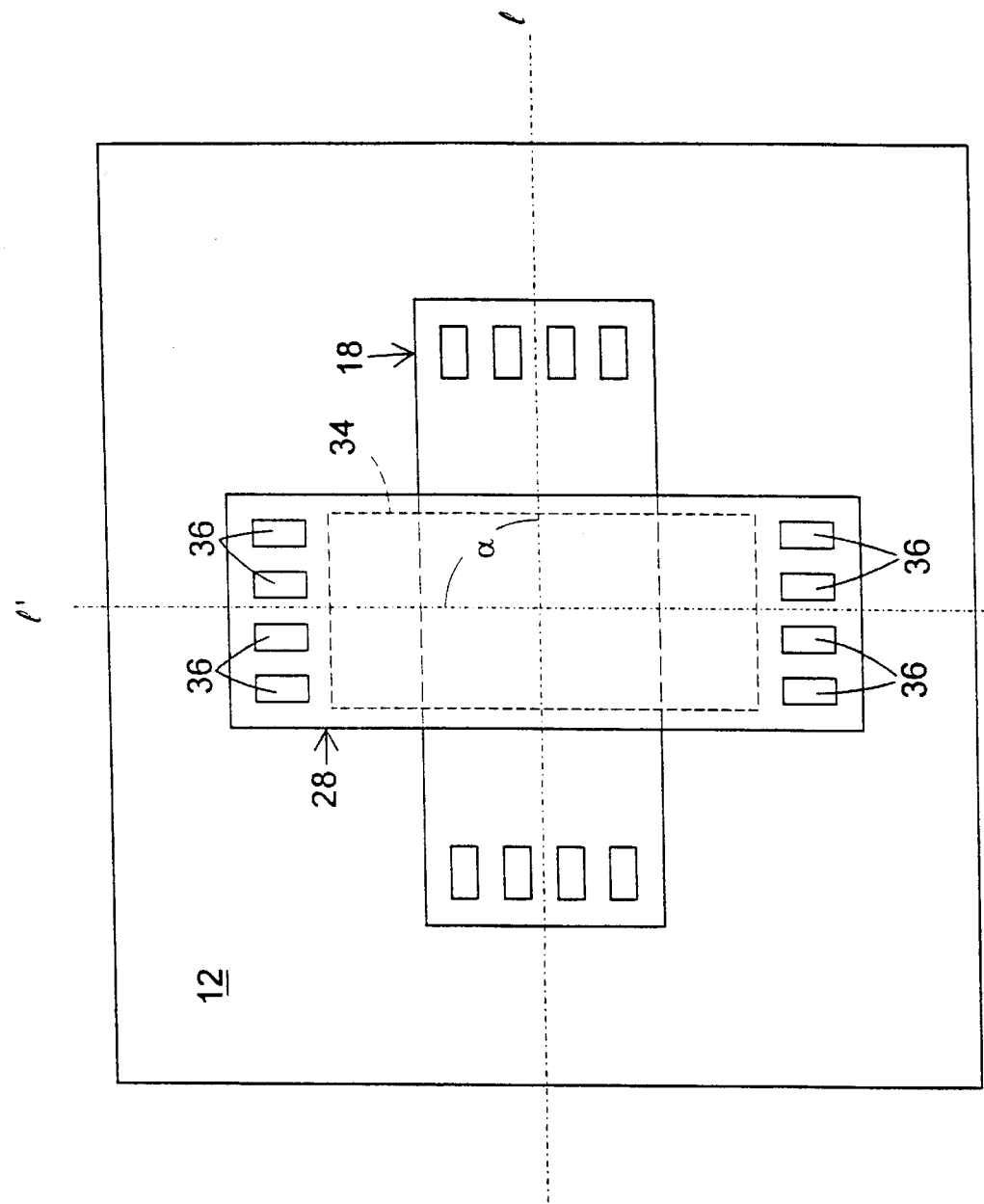

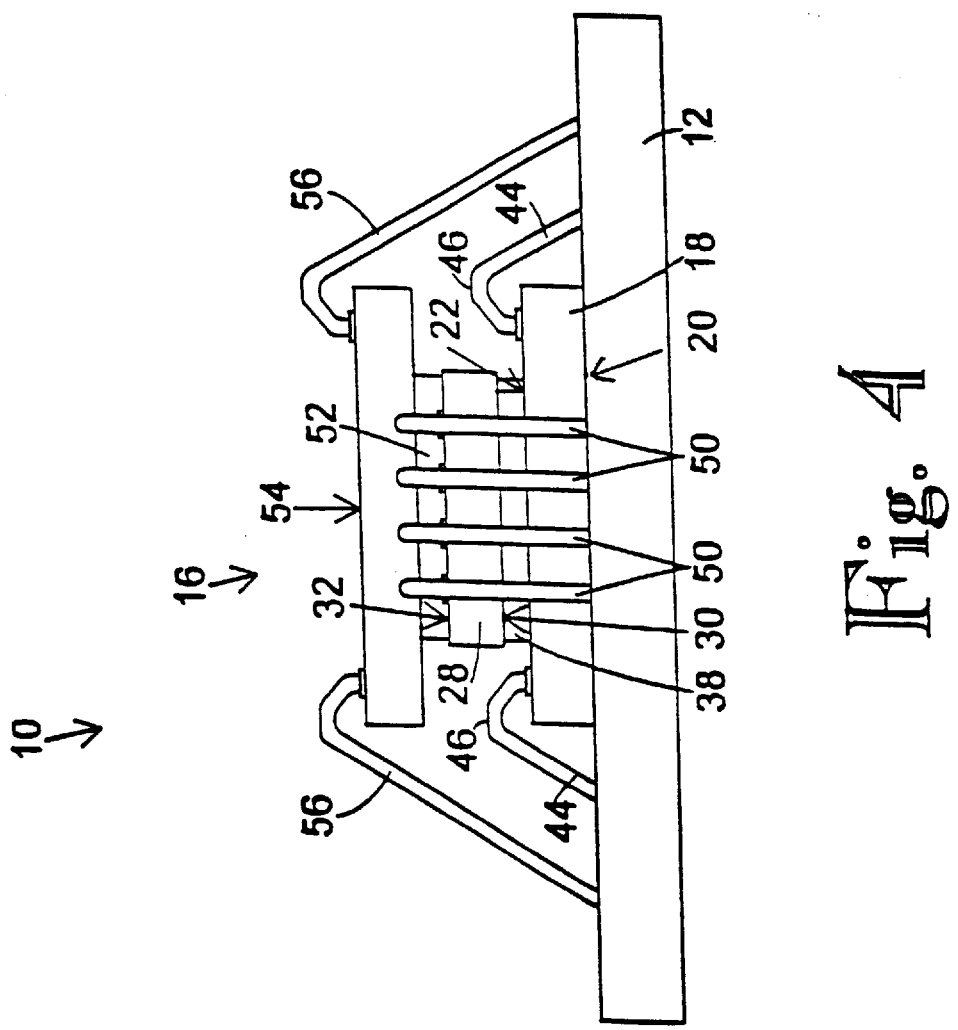

ANGULARLY OFFSET STACKED DIE MULTICHIP DEVICE AND METHOD OF MANUFACTURE

This application is a continuation, of application Ser. No. 08/515,719, filed Aug. 16, 1995, now abandoned.

BACKGROUND OF THE INVENTION

TECHNICAL FIELD

This invention generally relates to semiconductor devices. More particularly, this invention relates to a multichip module which employs stacked dice.

BACKGROUND

Semiconductor devices are constructed from a silicon or gallium arsenide wafer through a process which comprises a number of deposition, masking, diffusion, etching, and implanting steps. Usually, many individual devices are constructed on the same wafer. When the devices are sawed into individual rectangular units, each takes the form of an integrated circuit (IC) die. In order to interface a die with other circuitry, normally it is mounted on a lead-frame paddle, in the case of single chip construction, or a multichip module substrate which in either case are surrounded by a number of lead fingers within a lead-frame. Hereafter general reference will be made by use of the word "substrate" as meaning either a paddle or a multichip module substrate or their functional equivalents.

The die-mounting substrate of a standard lead-frame is larger than the die itself, and it is surrounded by multiple lead fingers of individual leads. Bonding pads on the die are connected one by one in a wire-bonding operation to the lead-frame's lead finger pads with extremely fine gold or aluminum wire. The lead-frames are connected together for manufacturing purposes into a strip. Each strip generally consists of a linear series of interconnected lead-frames, typically ten in a row, one after another. Then the die and the portion of the lead-frame to which the die is attached, are encapsulated in a plastic or ceramic material to form the chip package, as are all other die/lead-frame assemblies on the lead-frame strip. A trim-and-form operation then separates the resultant interconnected packages and bends the leads of each package into the proper configuration.

In many cases, multichip devices can be fabricated faster and more cheaply than a corresponding single IC which incorporates the same functions. Current multichip module construction typically consists of a printed circuit board substrate to which a series of separate components are directly attached. This technology is advantageous because of the increase in circuit density achieved. With increased density comes improvements in signal propagation speed and overall device weight. While integrated circuit density has and continues to increase at a significant rate, the density of the interconnecting circuitry between a die and its leads, and between two components within a multichip module, has not kept pace. Consequently, interconnection density has become a significant limiting factor in the quest for miniaturization.

U.S. Pat. No. 5,012,323, issued Apr. 30, 1991, having a common assignee with the present application, discloses a pair of rectangular integrated-circuit dice mounted on opposite sides of the lead-frame. An upper, smaller die is back-bonded to the upper surface of the lead fingers of the lead-frame via a first adhesively coated, insulated film layer. The lower, slightly larger die is face-bonded to the lower surface of the lead extensions within the lower lead-frame die-bonding region via a second, adhesively coated, insulative, film layer. The wire-bonding pads on both the upper die and the lower die are interconnected with the ends of their associated lead extensions by gold or aluminum wire. The lower die needs to be slightly larger for accessibility to the die pads from above allowing gold wire connections to the lead extensions or fingers.

U.S. Pat. No. 4,996,587 shows a semiconductor chip package which uses a chip carrier to support the chips within a cavity. The chip carrier as shown in the figures has a slot that permits connection by wires to bonding pads which, in turn, connect to the card connector by conductors. An encapsulation material is placed only on the top surface of the chip in order to provide heat dissipation from the bottom surface when carriers are stacked.

Japanese Patent No. 56-62351(A) issued to Sano in 1981 discloses three methods of mounting two chips on a lead-frame and attaching the pair of semiconductor chips or pellets to a common lead-frame consisting of: (method 1) two chips mounted on two paddles; (method 2) one chip mounted over a paddle and one below not attached to the paddle; and (method 3) one chip attached above and one chip attached below a common paddle.

U.S. Patent Nos. 5,232,060 and 5,291,061, both having a common assignee with the present application, teach arrangements of multichip stacked devices wherein a first die is attached to the substrate and wire bonded to the lead fingers, followed by a second die and so on. Both patents teach using an adhesive layer between two dice to provide clearance between the dice for the loops of the wire bonds. The wire bonds attaching an underlying die must be completed before another die can be stacked on the stack. This means that the die attachment process must be repeated for each additional layer of the stack. In addition to adding extra process steps, there is a chance of damaging the underlying wires. Additionally, because the clearances between two adjacent dice in the stack are quite tight, small variances in the loop height and adhesive thickness can lead to a compound error which results with the wire loops of the underlying die contacting or interfering with the upper die.

SUMMARY OF THE INVENTION

Accordingly, it is one object of the present invention to provide a stacked multichip device which allows at least two dice in a stack to be attached to the substrate prior to wire bonding.

Is it another object of the present invention to provide a stacked multichip device which does not restrict the loop height for the underlying die, thereby allowing thinner layers of adhesive separating the dies, facilitating ease and efficiency of wire bonding and reducing the overall height of the assembly.

In accordance with the present invention, these and other objects are achieved by an offset die stacking arrangement in connection with at least one upper level die having a width which is less than the distance separating the opposing bonding sites of the underlying die. The upper die is fixed above the lower die and rotated within a plane parallel to the lower die through an angle which insures that none of the bonding sites of the lower die are obstructed by the upper die. Dependent upon the geometries of the dice, additional dice can be stacked in this manner until the addition of an additional die would interfere with wire bonding of any of the lower dice. Once the dice are fixed in this manner, the entire assembly is subjected to the wire bonding process with all of the bonds being made in the same step. The entire process can then be repeated using the upper most die of the previous stack as the substrate.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

FIG. 3 is a top view of a first and second die attached to a substrate; and

FIG. 4 is a side view of a three die multichip device.

DETAILED DESCRIPTION OF THE INVENTION

Figure 1:
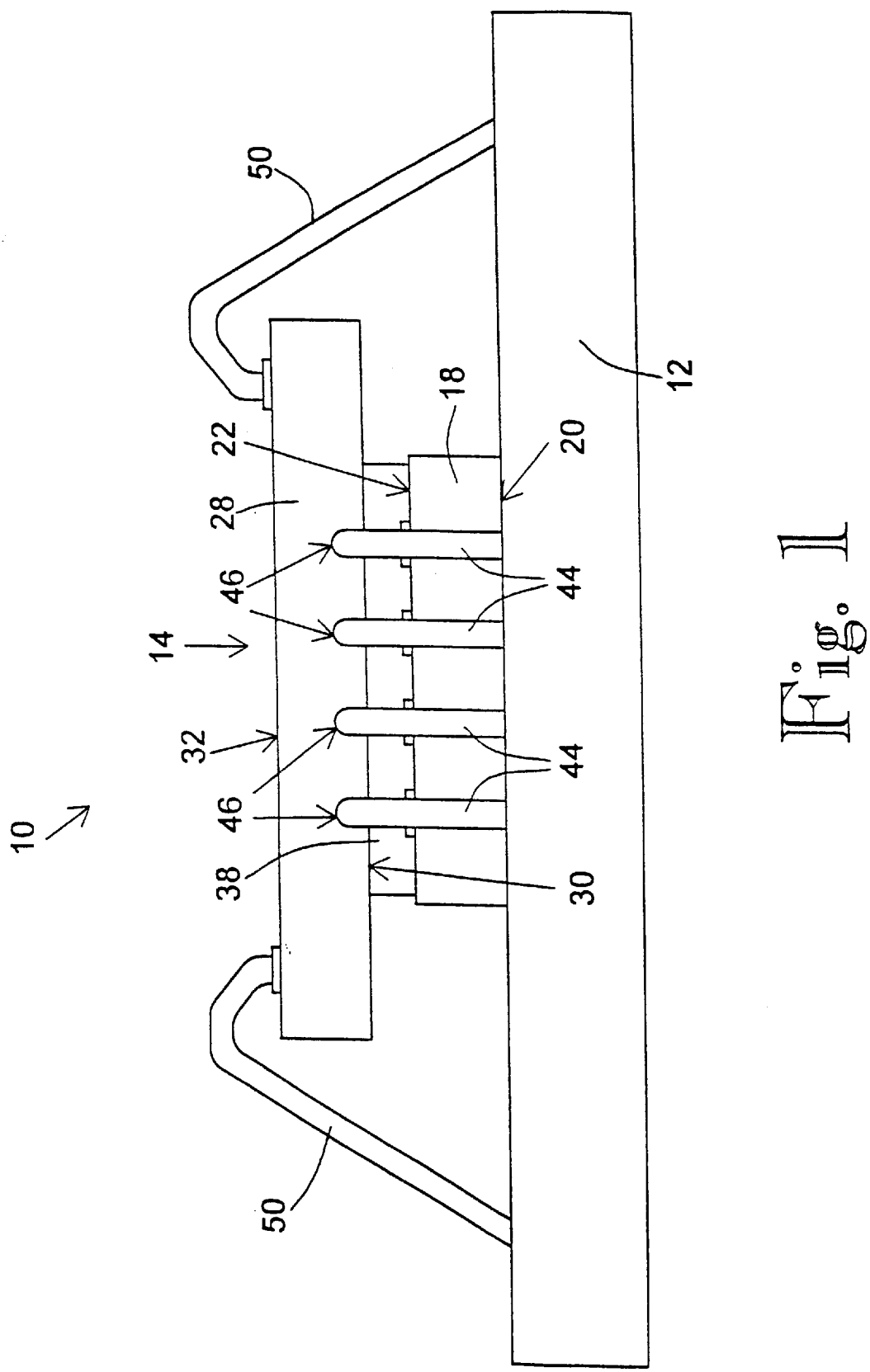
FIG. 1 is a side view of a two die multichip device.

Referring now to FIGS. 1–4, a multichip device according to the invention is designated generally at reference numeral 10. Such is comprised of a conventional substrate 12 which includes one or more Z-direction multichip stacks similar to those indicated at 14 and 16. For the purposes of this explanation, substrate 12 lies generally in the XY plain and the chip stacks extend upwardly parallel with the Z axis. However, it should be noted that the invention is not limited to this orientation and the coordinate system could describe stacks extending in the X or Y directions, as well as any other direction. Consequently, directional and position descriptors such as upper, lower, above, below, etc. are adopted merely for the convenience of illustration and explanation and are not intended to limit the orientation or scope of the invention.

Referring first to stack 14, such includes a lower first die 18 having opposed base and upper bonding surfaces 20 and 22, respectively. Base surface 20 is here adhered to substrate 12 by means of an adhesive, such as epoxy, thermoplastic materials, tape, tape coated with thermoplastic materials, etc. First die bonding face 22 includes a central area 24 and a plurality of bonding pads 26 which are peripheral to central area 24 and generally lie adjacent opposing side edges 27.

Multichip stack 14 also includes an upper second die 28 having opposed base and upper bonding surfaces 30 and 32, respectively. Second die bonding surface 32 includes a central area 34 and a plurality of bonding pads 36 peripheral to central area 34. A first adhesive layer 38 is interposed between and connects first die bonding surface 22 and second die base surface 30. First adhesive layer 38 is deposited within central area 24 inside of peripheral bonding pads 26.

Figure 2:
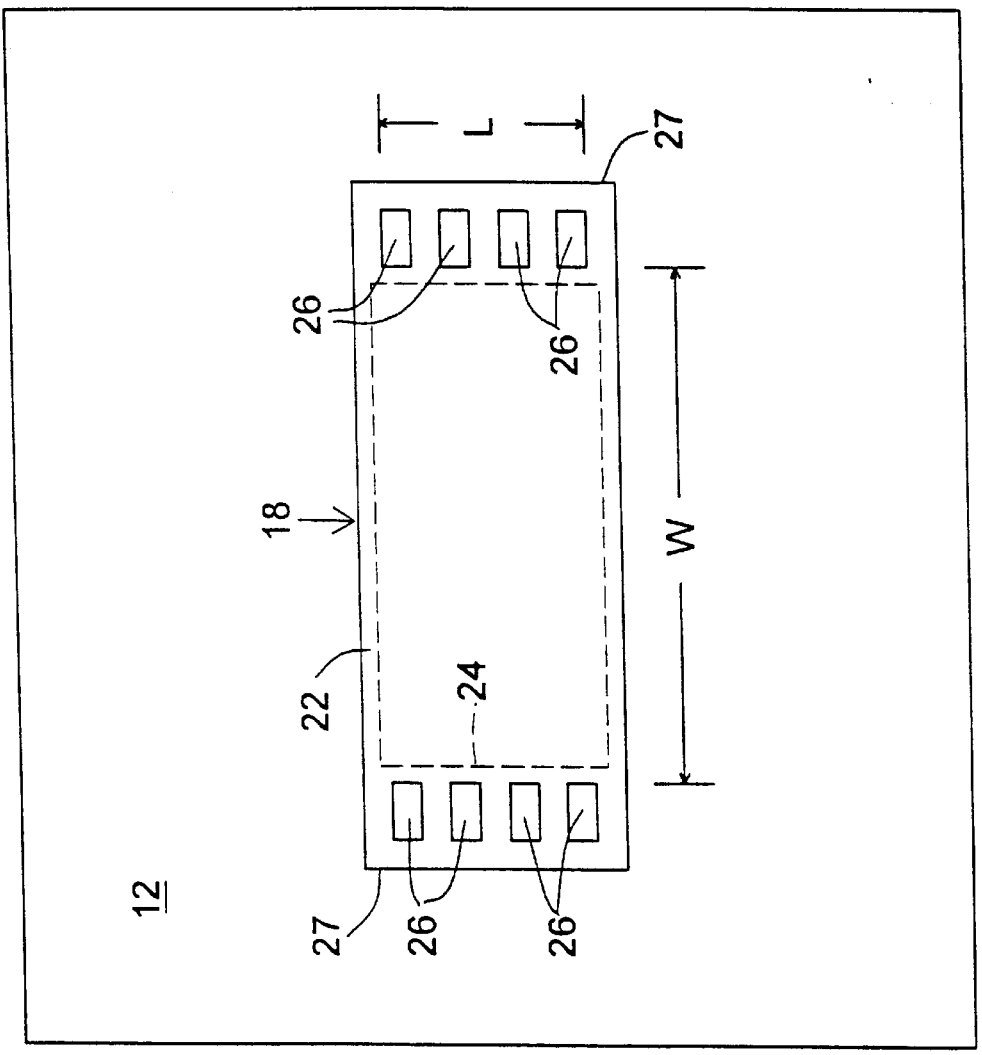
FIG. 2 is a top view of a first die attached to a substrate.

Referring particularly to FIGS. 2 and 3, upper second die 28 is angularly offset with respect to lower first die 18 at an angle which is sufficient to insure that accessibility to bonding pads 26 is not interfered with. The angular rotation of second die 28 occurs in a plane which is generally parallel to upper bonding surface 22 of first die 18. The width of upper second die 28 must be less than or equal to the perpendicular distance, W, separating opposing bonding pads 26 along opposite edges 27 of lower die 18. Constructing second die 28 with a width which is less than W allows for additional dies to be stacked without interfering with the vertical line of sight of any of the lower dies' bonding pads, thereby allowing wire bonding of all bonding sites in the same wire bonding process step. The angle of offset, α, represents the angle between the longitudinal centerline, l, of the underlying die and the longitudinal centerline, l', of the overlying die. The minimum angle of offset, α, required for a die having a given opposite bonding pad separating distance, W, and an aggregrate bonding pad length, L, is given by the formula $$\alpha = 2\tan^{-1}\left(\frac{L}{W}\right).$$

The maximum number, N, of chips or dies of a given opposite bonding pad separating distance, W, and a given distance, L, equal to the maximum distance between the outermost two edges of the two outermost bonding sites 26 on one of sides 27, is given by the formula $$N = \frac{180}{2\tan^{-1}\left(\frac{L}{W}\right)}.$$

Table 1 below lists the approximate maximum decimal expressions of R, which are the ratios of the length, L, per allowable separation distance, for a given number of dies or chips, N.

| N | R |
|---|---|
| 2 | 1 |
| 3 | .57 |
| 4 | .41 |
| 5 | .32 |
| 6 | .26 |
| 7 | .22 |
| 8 | .19 |
| 9 | .17 |

A plurality of bonding wires 44 are bonded to and between respective first die bonding pads 26 and substrate 12. Bonding wires 44 have outwardly projecting loops 46. A plurality of second bonding wires 50 are bonded to and between respective second die bonding pads 36 and substrate 12. An example of wire bonding equipment capable of producing such wire bonds and loops is the model 1484 XQ manufactured by Kulicke and Soffa Industries Inc. of Willow Groove, Pa. Wires 44 and 50 can be provided bare or be externally insulated between there respective connections to the die bonding pads and multichip module substrate.

Second multichip stack 16 is substantially similar to first stack 14, and includes a subsequent second adhesive layer 52 and third upper die 54. Thus, at least one additional adhesive layer and at least one additional die is mounted outwardly relative to the second die bonding face. Here the offset angle, α, is equal to 90° simply for ease of illustration. In this case, third die 54 is attached in a separate wire bonding step. Such third die includes a plurality of third die bonding wires 56. Third die 54 includes a central area 58 and associated peripheral bonding pads 60 which connect with third wires 56. Third die 54 can also include an overlying adhesive layer which can provide a level of additional protection to the top-most die in a multichip stack. Thus, third die 54 can be considered as an outermost chip, with second adhesive layer 52 and/or second die 28 and/or first adhesive 38 being considered as intervening material interposed between the first die bonding surface and the outermost die base surface.

While there is shown and described the preferred embodiment of the invention, it is to be distinctly understood that this invention is not limited thereto but may be variously embodied to practice within the scope of the following claims.

We claim:

1. A stacked die multichip device comprising:
 a substrate;
 a lower die having two opposing side edges each including bonding sites therealong, a base surface and an upper surface, the lower die being attached to the substrate with the lower die's base surface facing the substrate;
 an upper die having a width less than the perpendicular distance separating any two opposing bonding sites along the opposing side edges of the lower die, this perpendicular distance being defined as W;
 the upper die further having a base surface and an upper surface;
 the upper die being attached above the lower die with the upper die's base surface facing the upper surface of the lower die; and
 the upper die being rotated, in a plane substantially parallel to the upper surface of the lower die, through an angle sufficient to insure that no portion of the upper die interferes with a vertical line of sight of any bonding site on the lower die to permit wire bonding of the same, the upper die being fixed in this position, wherein the angle of rotation for the upper die is defined as the minimum offset angle, $\alpha$, and is at least equal to the value given by the formula $$\alpha = 2\tan^{-1}\left(\frac{L}{W}\right),$$

where L is equal to the maximum distance between two outermost edges of any two bonding sites along one of the sides of the first die.

2. The device of claim 1 further comprising at least one additional upper die mounted on the second die in an analogous configuration as that of the second die, where the total number of dies, N, is limited by the formula.

$$N = \frac{180}{2\tan^{-1}\left(\frac{L}{W}\right)}.$$

3. A method for manufacturing a multichip module comprising the steps of:
 affixing a lower die to a substrate, the lower die having two opposing side edges each including bonding sites therealong, a base surface and an upper surface, the lower die being attached to the substrate with the lower die's base surface facing the substrate;
 orienting an upper die having a width less than the perpendicular distance separating any two opposing bonding sites along the opposing side edges of the lower die, this perpendicular distance being defined as W, the upper die further having a base surface and an upper surface, by rotating the upper die in a plane substantially parallel to the upper surface of the lower die, through an angle sufficient to insure that no portion of the upper die interferes with a vertical line of sight of any bonding site on the lower die to permit wire bonding of the same, the upper die being fixed in this position; and
 attaching the upper die above the lower die with the upper die's base surface facing the upper surface of the lower die in this orientation, wherein the upper die is oriented through an angle of rotation defined as the minimum offset angle, $\alpha$, and is at least equal to the value given by the formula $$\alpha = 2\tan^{-1}\left(\frac{L}{W}\right),$$

where L is equal to the maximum distance between two outermost edges of any two bonding sites along one of the sides of the first die.

4. The method of claim 3 further comprising attaching at least one additional upper die mounted on the second die in an analogous configuration to the attachment of the second die, where the total number of dies, N, is limited by the formula.

$$N = \frac{180}{2\tan^{-1}\left(\frac{L}{W}\right)}.$$

5. An electronic circuit assembly which comprises:
 a circuit board;
 a first die attached to the circuit board;
 a second die fixed above the first die, the second die being dimensioned and oriented, through an angle with respect to the first die, sufficient to ensure that no portion of the second die interferes with an orthogonal line of sight of any wire bonding site on the first die.

6. The circuit assembly of claim 5 wherein the angle through which the second die is rotated is at least equal to the value calculated by the equation $$2\tan^{-1}\left(\frac{L}{W}\right),$$

where L is equal to a maximum distance between two outermost edges of any two bonding sites along a side of the first die and W is equal to a perpendicular distance separating any two opposing bonding sites along opposing side edges of the first die.

7. An electronic circuit assembly which comprises:
 a circuit board;
 a lower die attached to the circuit board to form a base of a die stack;
 a plurality of dies fixed on the die stack, each dimensioned and oriented, through an angle with respect to an immediately adjacent die lower in the stack, sufficient to ensure that no portion of any die interferes with an orthogonal line of sight of any wire bonding site on any dies below in the stack.

8. The circuit assembly of claim 7 wherein the angle through which the each of the plurality dies is rotated is at least equal to the value calculated by the equation $$2\tan^{-1}\left(\frac{L}{W}\right),$$

where L is equal to a maximum distance between two outermost edges of any two bonding sites along a side of an immediately adjacent die lower in the stack and W is equal to a perpendicular distance separating any two opposing bonding sites along opposing side edges of an immediately adjacent die lower in the stack.

9. An electronic circuit assembly which comprises:
a circuit board;
a first die attached to the circuit board, the first die having a die attachment area of known width and located separate from any wire bonding sights on the first die;
a second die fixed above the first die, the second die having a width dimension less than the width of the die attachment area on the first die and oriented, through an angle, sufficient to ensure that no portion of the second die interferes with an orthogonal line of sight of any wire bonding site on the first die.

10. The circuit assembly of claim 9 wherein the angle through which the second die is rotated is at least equal to the value calculated by the equation $$2\tan^{-1}\left(\frac{L}{W}\right),$$

where L is equal to a maximum distance between two outermost edges of any two bonding sites along a side of the first die and W is equal the width of the second die.

11. An electronic circuit assembly which comprises:
a circuit board;
a lower die attached to the circuit board to form a base of a die stack, the lower die having a die attachment area of known width and located separate from any wire bonding sights on the first die;
a plurality of dies fixed on the die stack, each having a die attachment area of known width and located separate from any wire bonding sights on that particular die, each die of the plurality of dies further having a width dimension less than the width of the die attachment area on any lower dies in the stack and oriented, through an angle, sufficient to ensure that no portion of any die interferes with an orthogonal line of sight of any wire bonding site on any dies below in the stack.

12. The circuit assembly of claim 11 wherein the angle through which the each of the plurality of dies is rotated is at least equal to the value calculated by the equation $$2\tan^{-1}\left(\frac{L}{W}\right),$$

where L is equal to a maximum distance between two outermost edges of any two bonding sites along a side of an immediately adjacent die lower in the stack and W is equal to the width of the die within the plurality of dies and W is less than the width of the attachment area on the immediately adjacent die lower in the stack.

* * * * *

UNITED STATES PATENT AND TRADEMARK OFFICE
CERTIFICATE OF CORRECTION

PATENT NO : 5,874,781

DATED : February 23, 1999

INVENTOR(S) : Rich Fogal and Michael B. Ball

It is certified that error appears in the above-identified patent and that said Letters Patent is hereby corrected as shown below:

At column 4, line 7, replace "aggregrate" with --aggregate--.

Signed and Sealed this

Eighth Day of February, 2000

Attest:

Q. TODD DICKINSON

Attesting Officer

Commissioner of Patents and Trademarks